(12) United States Patent
Chang et al.

(10) Patent No.: US 10,985,124 B2
(45) Date of Patent: Apr. 20, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Kuo-Chin Chang, Chiayi (TW); Yen-Kun Lai, New Taipei (TW); Kuo-Ching Hsu, Taipei (TW); Mirng-Ji Lii, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 74 days.

(21) Appl. No.: 15/960,222

(22) Filed: Apr. 23, 2018

(65) Prior Publication Data
US 2019/0326244 A1    Oct. 24, 2019

(51) Int. Cl.
| | |
|---|---|
| *H01L 23/00* | (2006.01) |
| *H01L 21/66* | (2006.01) |
| *H01L 21/768* | (2006.01) |
| *H01L 23/528* | (2006.01) |
| *H01L 23/538* | (2006.01) |

(52) U.S. Cl.
CPC ........ *H01L 24/14* (2013.01); *H01L 21/76877* (2013.01); *H01L 22/32* (2013.01); *H01L 23/5384* (2013.01); *H01L 23/562* (2013.01); *H01L 24/06* (2013.01); *H01L 2224/0401* (2013.01); *H01L 2924/35121* (2013.01)

(58) Field of Classification Search
None
See application file for complete search history.

(56) References Cited

U.S. PATENT DOCUMENTS

| | | | | |
|---|---|---|---|---|
| 2009/0115058 | A1* | 5/2009 | Yu | H01L 24/02 257/738 |
| 2013/0087892 | A1* | 4/2013 | Yew | H01L 24/06 257/621 |
| 2013/0093079 | A1* | 4/2013 | Tu | H01L 23/3114 257/737 |
| 2014/0038405 | A1* | 2/2014 | Yu | H01L 24/13 438/613 |
| 2015/0137350 | A1* | 5/2015 | Huang | H01L 24/05 257/737 |
| 2016/0099221 | A1* | 4/2016 | Chiang | H01L 24/03 257/773 |
| 2016/0111363 | A1* | 4/2016 | Chen | H01L 23/5329 257/741 |

* cited by examiner

*Primary Examiner* — Mounir S Amer
(74) *Attorney, Agent, or Firm* — WPAT, P.C., Intellectual Property Attorneys; Anthony King

(57) ABSTRACT

A semiconductor structure includes a substrate having a surface and a conductive via in the substrate. The surface has an inner region and an outer region surrounding the inner region. The semiconductor structure also includes an under bump metallurgy (UBM) pad on the surface and within the outer region, where the UBM pad has a first zone and a second zone. The first zone faces towards a center of the surface and the second zone faces away from the center of the surface. The conductive via is disposed outside the second zone and at least partially overlaps the first zone from a top view perspective.

20 Claims, 8 Drawing Sheets

SEMICONDUCTOR STRUCTURE AND MANUFACTURING METHOD THEREOF

BACKGROUND

Electronic equipment using semiconductor structures is essential for many modern applications. With the advancement of electronic technology, semiconductor structures are becoming increasingly compact while providing expanded functionality and comprising greater amounts of integrated circuitry. With the expanded functionality and reduced scale of the semiconductor structure, numerous manufacturing operations are implemented with increased complexity.

The manufacturing of the semiconductor structure involves performance of many steps and operations on a compact semiconductor structure. The manufacturing of the semiconductor structure with an increased interconnect density is becoming increasingly complicated. An increase in complexity of the manufacturing of the semiconductor structure may result in deficiencies such as degraded electrical performance or other issues, resulting in a high yield loss of the semiconductor structure and an increase in manufacturing cost. Accordingly, there are many challenges to be overcome in modifying the design and improving the manufacturing process of the semiconductor structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
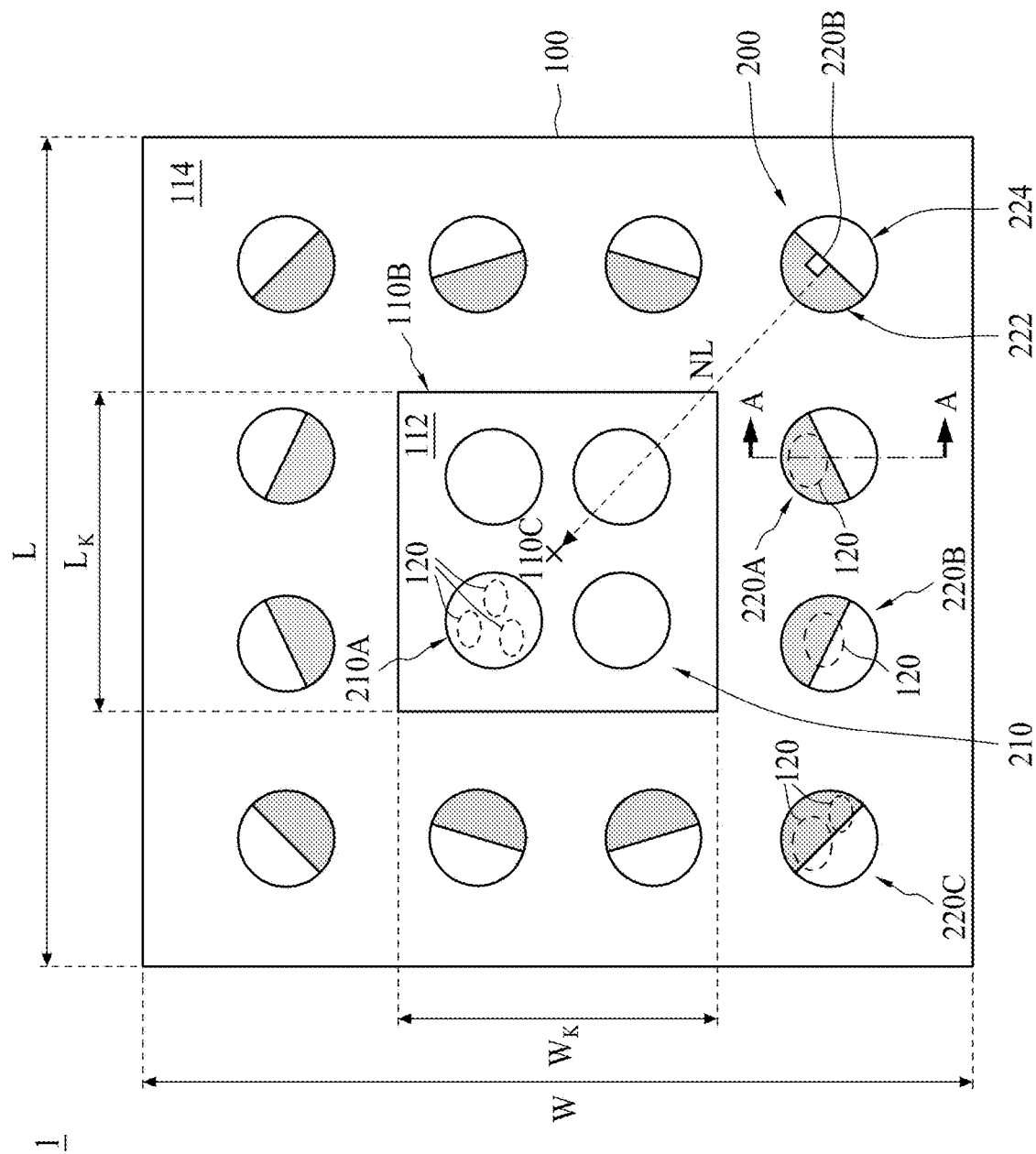
FIG. 1 is a schematic top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled," and the term "connected" may be termed as "electrically connected." "Coupled" and "connected" may also be used to indicate that two or more elements cooperate or interact with each other.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or 3DIC device, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the advancement of electronic technology, semiconductor or package structures are becoming increasingly compact while providing expanded functionality and comprising greater amounts of integrated circuitry. In order to further increase interconnect density or reduce the interconnect length, several structures or layers may need to be designed in such a way as to overlap with one another. Conventionally, however, overlapping or intensive arrangements of structures having different values for properties such as stiffness or coefficient of thermal expansion (CTE) may lead to unbalanced stress distribution, which is undesirable. Unbalanced stress distribution may result in structure damage, such as cracking or delamination, within the semiconductor structure. Therefore, the above concerns and risks limit the intensive or compact design for semiconductor structure.

For example, in a conventional wafer level chip scale packaging (WLCSP) product, a conductive via structure may be prevented from being disposed directly under an under bump metallurgy (UBM) pad structure. Since the conductive via structure may be under a high tensile stress region, the stress will be easily transmitted and will rise dramatically compared to a structure without a conductive via. Such stress transmission may lead to poor reliability or delamination of structures such as an extreme low-K (ELK) layer, a conductive via or an aluminum pad (AP). Therefore, according to typical design rules, a conductive via structure is not allowed to be disposed within the UBM pad edge. Conventionally although a layout designer may wish to position a conductive via structure within coverage of a UBM pad to achieve a compact structure, there is no clear method to define a keep-out zone for a conductive via structure.

In some embodiments, the present disclosure provides a semiconductor structure in which a conductive via structure is disposed in a specified area covered by a UBM pad in order to achieve a compact design while maintaining structural strength. In some embodiments, the present disclosure provides a method of manufacturing a semiconductor structure wherein a keep-out zone for a conductive via structure is defined, and the conductive via structure may be disposed in a specified area within a covered area of a UBM pad range in order to save space. The present disclosure provides a keep-out zone for a conductive via structure within a UBM pad range in order to reduce the risk of ELK and Cu/Al pad delamination when there is no underfill structure. According to some embodiments of the present disclosure, a semiconductor structure can be designed to include an optimized via-available region, which a layout designer may utilize in a design rule map.

In some embodiments of the present disclosure, a semiconductor structure is disclosed. The semiconductor structure includes a substrate, an under bump metallurgy (UBM) pad, and a conductive via. The substrate has a surface. The surface has an inner region and an outer region surrounding the inner region. The UBM pad is on the surface and within the outer region, and has a first zone and a second zone. The conductive via is under the surface, outside the second zone, and at least partially overlaps the first zone from a top view perspective. The first zone faces towards a center of the surface, and the second zone faces away from the center of the surface.

In some embodiments of the present disclosure, the semiconductor structure includes a substrate, a UBM pad, and a conductive via. The substrate has a surface. The surface has an inner region and an outer region surrounding the inner region. The UBM pad is on the surface and within the outer region, and has a first zone and a second zone. The conductive via is under the surface, and at least partially overlaps the first zone from a top view perspective. The first zone faces towards a center of the surface, and the second zone faces away from the center of the surface. A portion of the conductive via overlapping the first zone from a top view perspective is larger than a portion of the conductive via overlapping the second zone from a top view perspective.

Figure 2:
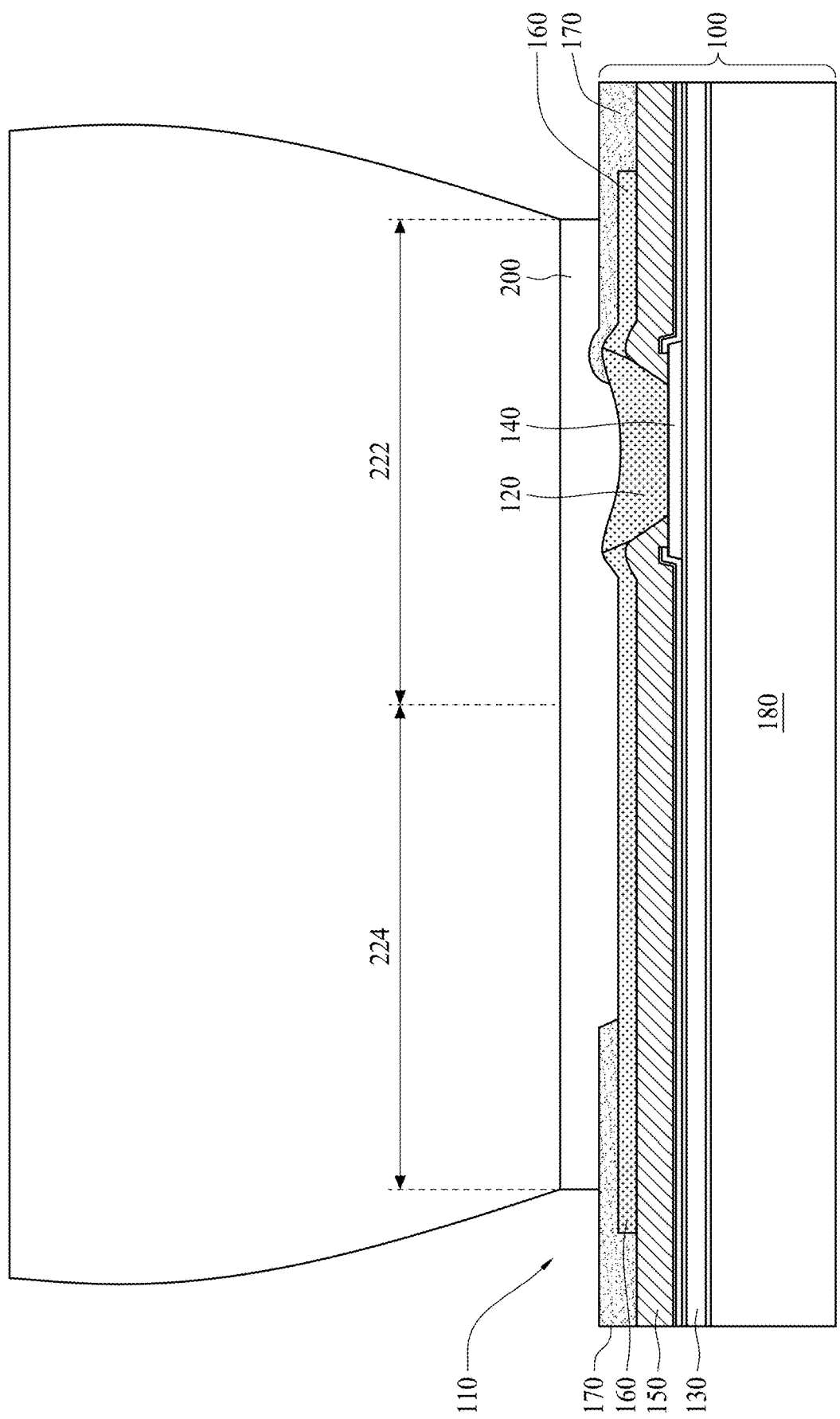
FIG. 2 is a schematic cross-sectional view of a semiconductor structure in accordance with some embodiments of the present disclosure.

FIG. 1 is a top view of a semiconductor structure 1 in accordance with some embodiments of the present disclosure. FIG. 2 is a cross-sectional view taken along sectional line AA across an exemplary UBM pad 220A of the semiconductor structure 1, in accordance with some embodiments of the present disclosure. Some features of FIG. 2, such as conductive bumps 300, are not shown in FIG. 1 for clarity. Referring to FIGS. 1 and 2, the semiconductor structure 1 includes a substrate 100 and several UBM pads 200. As shown in FIG. 2, the substrate 100 has a surface 110. The UBM pads 200 are disposed on the surface 110.

In some embodiments, the semiconductor structure 1 is part of a semiconductor package. In some embodiments, the semiconductor structure 1 is a multi-dimensional package such as a three-dimensional (3D) package. In some embodiments, the semiconductor structure 1 is a part of an integrated fan-out (InFO) package. In some embodiments, the semiconductor structure 1 is a part of a chip on wafer (CoW) structure, a chip on wafer on substrate (CoWoS) structure, or a wafer level chip scale package (WLCSP).

In some embodiments, the substrate 100 is fabricated with a predetermined functional circuit thereon. In some embodiments, the substrate 100 includes several conductive lines and several electrical components such as transistor, diode, etc. connected by the conductive lines. In some embodiments, the substrate 100 is a semiconductive substrate. In some embodiments, the substrate 100 includes an interposer or a wafer. In some embodiments, the substrate 100 includes a silicon substrate or silicon wafer. In some embodiments, the substrate 100 can be a printed circuit board (PCB).

In some embodiments, the substrate 100 includes a semiconductive material such as silicon, germanium, gallium, arsenic, or combinations thereof. In some embodiments, the substrate 100 includes material such as ceramic, glass, organic material, etc. In some embodiments, the substrate 100 includes a glass substrate or a glass wafer. In some embodiments, the substrate 100 has a quadrilateral, rectangular, square, polygonal or any other suitable shape. In some embodiments, the surface 110 is a front surface or an active surface where the circuits are disposed. In some embodiments, some conductors such as conductive bumps or metallic pads (not shown) are disposed in the vicinity of the second surface 220 for electrical connection with external components such as another PCB.

Referring to FIG. 1, in some embodiments, an inner region 112 and an outer region 114 are defined on the surface 110 of the substrate 100. In the embodiment shown in FIG. 1, the outer region 114 surrounds the inner region 112. In some embodiments, the outer region 114 borders the inner region 112 with a boundary 110B. In some embodiments, the outer region 114 is a peripheral region of the substrate 100. The boundary 110B is an outline or periphery of the inner region 112. The surface 110 has a geometric center 110C. The center 110C is also the center of the inner region 112. In some embodiments, the outer region 114 includes the entire area of the surface 110 other than the inner region 112.

The UBM pads 200 on the surface 110 include several UBM pads 210 and several UBM pads 220. The UBM pads 210 are disposed in the inner region 112 and the UBM pads 220 are disposed in the outer region 114. As shown in FIG. 1, the surface of each UBM pad 220 defines a first zone 222 (indicated by shaded regions or dotted patterns within the UBM pad 200) and a second zone 224 (indicated by white regions within the UBM pad 200). The first zone 222 contacts the second zone 224. The first zone 222 faces towards the center 110C of the surface 110, and the second zone 224 faces away from the center 110C of the surface 110. As such, the first zone 222 and second zone 224 of each UBM pad 220 have specific orientations according to the position of their respective UBM pad 220 on the substrate 100. Each UBM pad 220 has a boundary line 220B between the first zone 222 and the second zone 224. As shown in FIG. 1, the boundary line 220B is perpendicular to a normal line NL, where the normal line NL may be representative of the orientation of the UBM pad 220 and connects a center of the UBM pad 220 to the center 110C of the surface 110. As such, the boundary line 220B of each UBM pad 220 has a corresponding orientation according to the position of the respective UBM pad 220 in the outer region 114. In some embodiments, in each combination of the first zone 222 and second zone 224 of a UBM pad 220, the distance from the first zone 222 to the geometric center 110C is less than the distance from the second zone 224 to the geometric center 110C.

In FIG. 1, there are twelve UBM pads 220 shown in the outer region 114 and four UBM pads 210 shown in the inner region 112. However, the present disclosure is not limited thereto. The number or arrangement of the UBM pads 220 or the UBM pads 210 can be adjusted according to different designs. In some embodiments, there may be no UBM pads 210, that is, all UBM pads 200 are within the outer region 114. In some embodiments, the arrangement of the UBM pads 210 or the UBM pads 220 may be symmetric or asymmetric on the surface 110.

In some embodiments, the UBM pads 200 are disposed on the surface 110 by electroplating. In some embodiments, the UBM pads 200 include a conductive material such as gold, silver, copper, nickel, tungsten, aluminum, and/or alloys thereof. The UBM pad 200 may have a solderable surface which is exposed through the surface 110 for receiving a conductive bump that electrically connects the UBM pad 200 to a circuitry or another substrate external to the substrate 100. As shown in FIG. 2, in some embodiments, one UBM pad 200 is configured for receiving a conductive bump 300. The conductive bump 300 may include copper, tin, lead or other metal. The UBM pad 200 may be bonded with the conductive bump 300 using a thermal treatment such as a reflow process.

In some embodiments, as shown in FIG. 2, the substrate 1 includes a conductive via 120, a semiconductor die 180, an ELK layer 130, a conductive pad 140, a first insulation layer 150, a redistribution layer (RDL) 160 and a second insulation layer 170. The conductive via 120 is disposed under the surface 110. In some embodiments, the conductive via 120 is disposed under a UBM pad 200. The conductive via 120 may be exposed through the surface 110 and disposed under any one of the UBM pads 200 shown in FIG. 1.

The semiconductor die 180, the ELK layer 130, the first insulation layer 150, the RDL 160 and the second insulation layer 170 may be part of the substrate 100. In some embodiments, the semiconductor die 180 comprises semiconductive materials such as silicon, and the semiconductor die 180 is fabricated with a predetermined functional circuit included within the semiconductor die 180, wherein the predetermined functional circuit is produced by operations such as photolithography, etching, deposition, or other operations. In some embodiments, the semiconductor die 180 is singulated from a silicon wafer by a mechanical blade or a laser blade. In some embodiments, the semiconductor die 180 is a chip, a device, or the like. In some embodiments, the semiconductor die 180 comprises a variety of electrical circuits suitable for a particular application. In some embodiments, the electrical circuits include various devices such as transistors, capacitors, resistors, diodes, and/or other devices. In some embodiments, the semiconductor die 180 has a quadrilateral, a rectangular or a square shape when viewed from above.

In some embodiments, the ELK layer 130 is disposed over the semiconductor die 180. In some embodiments, the ELK layer 130 is disposed on and in contact with the semiconductor die 180. In some embodiments, the ELK layer 130 is an inter-metal dielectric (IMD) layer and comprises a dielectric material such as nitride or oxide. In some embodiments, the ELK layer 130 has a dielectric value (k-value) less than 3.8. In some embodiments, the ELK layer 130 has a dielectric value (k-value) less than 3.0.

In some embodiments, the first insulation layer 150 is disposed over the ELK layer 130. In some embodiments, the first insulation layer 150 is disposed on and in contact with the ELK layer 130. In some embodiments, the second insulation layer 170 is disposed over the first insulation layer 150. In some embodiments, the second insulation layer 170 is disposed on and in contact with the first insulation layer 150. In some embodiments, at least one of the first insulation layer 150 and the second insulation layer 170 includes a dielectric material, such as polyimide (PI), polybenzoxazole (PBO), benzocyclobuten (BCB), epoxy, or the like.

In some embodiments, the conductive pad 140 is disposed between the semiconductor die 180 and the conductive via 120. In some embodiments, the conductive pad 140 is electrically connected to the semiconductor die 180 and the conductive via 120. In some embodiments, the conductive pad 140 is at least partially covered by the first insulation layer 150. In some embodiments, the conductive pad 140 is at least partially surrounded by the first insulation layer 150. In some embodiments, a portion of the conductive pad 140 is exposed through the first insulation layer 150 and is in contact with the conductive via 120. In some embodiments, the conductive pad 140 has a cylindrical, hemispherical or spherical shape. In some embodiments, the conductive pad 140 includes gold, silver, copper, nickel, tungsten, aluminum, titanium, palladium and/or alloys thereof.

In some embodiments, the conductive via 120 is disposed on the conductive pad 140. In some embodiments, the conductive via 120 is electrically connected to the RDL 160. In some embodiments, the conductive via 120 is part of the RDL 160 and includes a vertical portion extending through the first insulation layer 150 and the second insulation layer 170. In some embodiments, the conductive via 120 and the RDL 160 are integrally formed in the same process, such as a plating process. In some embodiments, the conductive via 120 or the RDL 160 is at least partially surrounded by the first insulation layer 150 or the second insulation layer 170. In some embodiments, the conductive via 120 or the RDL 160 is at least partially covered by the second insulation layer 170. In some embodiments, a portion of the conductive via 120 or a portion of the RDL 160 is exposed through the second insulation layer 170 and is in contact with the UBM 200. The UBM pad 200 may be configured to conductively couple the conductive via 120 or the RDL 160 to the conductive bump 300.

Referring to FIGS. 1 and 2, in some embodiments, the conductive via 120 is coupled to the UBM pad 220 at a location outside the second zone 224 from a top view perspective. In some embodiments, there is no conductive via structure within the area covered by the second zone 224, as illustrated by the UBM 220A of FIG. 1. In some embodiments, the conductive via 120 at least partially overlaps the first zone 222 of one UBM pad 220, such as UBM pad 220B, from a top view perspective. In some embodiments, there are several conductive vias 120 at least partially overlapping, from a top view perspective, a first zone 222 of a UBM pad 220, such as UBM pad 220C. In some embodiments, one or more conductive vias 120 at least partially overlap, from a top view perspective, a UBM pad 210, such as UBM pad 210A, in the inner region 112.

Referring to FIG. 2, in some embodiments, the conductive via 120 at least partially overlaps the ELK layer 130 from a top view perspective. In some embodiments, with further reference to the UBM pad 220A in FIG. 1, a portion of the first zone 222, a portion of the conductive via 120, and a portion of the ELK layer 130 overlap each other from a top view perspective.

In some embodiments, as illustrated by the UBM pad 220B of FIG. 1, the conductive via 120 partially overlaps the first zone 222 and the second zone 224, and the portion of the conductive via 120 that overlaps the first zone 222 from a top view perspective is larger than the portion of the conductive via 120 that overlaps the second zone 224 from a top view perspective. In some embodiments, the conductive via 120 is closer to an edge of the first zone 222 that faces towards the center 110C than to an edge of the second zone 224 that faces away from the center 110C.

In some embodiments, the relative distance between the geometric center (from a top view perspective) of each conductive via 120 and the geometric center (from a top view perspective) of the respective UBM pad 220 (i.e., the UBM pad 200 within the outer region 114) may be different based on the location of the UBM pad 220 on the substrate 100. In some embodiments, among the UBM pads 220 within the outer region 114, if a UBM pad 220 is disposed closer to the boundary or edge of the substrate 100, then its corresponding conductive via 120 will be determined to be farther away from the boundary or edge of the substrate 100 while still at least partially within the coverage of the first zone 222. In some embodiments, among the UBM pads 220 within the outer region 114, if a UBM pad 220 is disposed closer to the boundary or edge of the substrate 100, then the geometric center of its corresponding conductive via 120 will be determined to be farther away from the boundary or edge of the substrate 100 while still within the coverage of the first zone 222. In some embodiments, among the UBM pads 220 within the outer region 114, if a UBM pad 220 is disposed closer to the boundary or edge of the substrate 100, then the geometric center of its corresponding conductive via 120 will be determined to be farther away from the geometric center of the corresponding UBM pad 220 while the conductive via 120 may still be largely within the coverage of the first zone 222.

In some embodiments, each UBM pad 220 has a circular shape. Within each UBM pad 220, the first zone 222 has a semicircular shape and accounts for one half of the surface of the UBM pad 220, and the second zone 224 has a semicircular shape and accounts for the other half of the surface of the UBM pad 220. An arc or curved edge of the semicircular shape of the first zone 222 faces towards the center 110C, and an arc or curved edge of the semicircular shape of the second zone 224 faces away from the center 110C. In some embodiments, the semicircular shape of the first zone 222 or the second zone 224 is aligned with a normal line drawn from a center of the UBM pad 220 to the center 110C of the surface 110. In some embodiments, the first zone 222 may have a quarter-circular shape and accounts for a quarter of the surface of the UBM pad 220, and a curved edge or an arc of the quarter-circular shape faces towards the center 110C.

Referring to FIG. 1, in some embodiments, a relationship between the inner region 112 and the surface 110 is defined as follows:

$$L_K \leq 0.1 \times L^{1.8}, W_K \leq 0.1 \times W^{1.8},$$

wherein $L_K$ is a length of the inner region 112, L is a length of the surface 110, $W_K$ is a width of the inner region 112, and W is a width of the surface 110. In some embodiments, L is also a length of the outer region 114, and W is also a width of the outer region 114.

Figure 3:
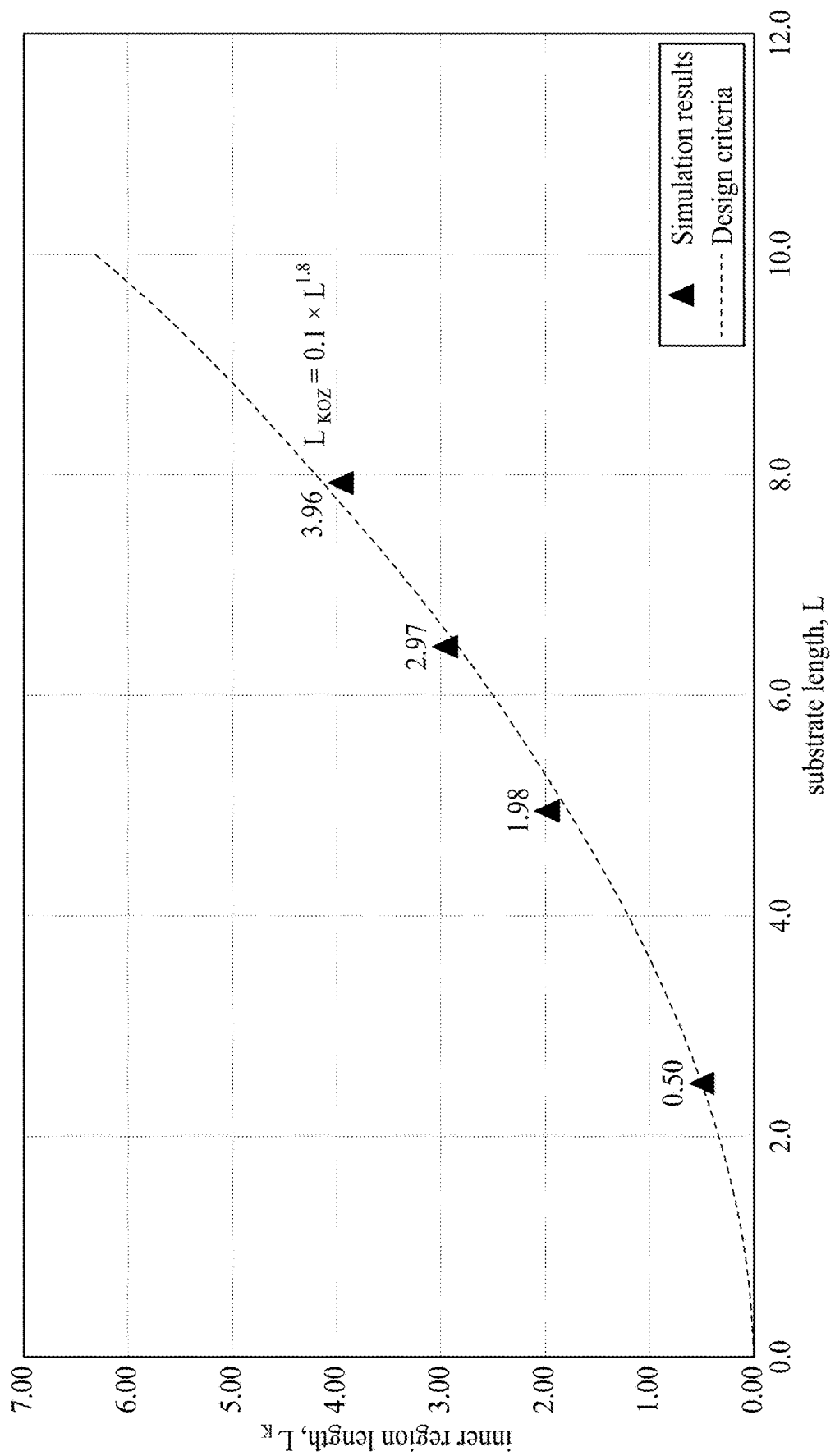
FIG. 3 is a plot showing a relationship between the geometry of a semiconductor structure and the geometry of an inner region within a surface of the semiconductor structure, in accordance with some embodiments of the present disclosure.

FIG. 3 is a plot showing a relationship between the geometry of the semiconductor structure 1 and the geometry of an inner region 112 of the surface 110 of the semiconductor structure 1, in accordance with some embodiments of the present disclosure. As shown in FIG. 3, $L_K$ is about $0.1 \times L^{1.8}$, and $W_K$ is about $0.1 \times W^{1.8}$. For example, a chip with a size of about 2.5 mm×2.5 mm may be defined with an inner region 112 with a size of about 0.52 mm×0.52 mm.

In some embodiments, the inner region 112 is defined to be an allowable region for conductive via arrangement. One or several conductive vias 120 may be disposed within the inner region 112 and under one or more UBM pads 210 within the inner region 112. The location of the conductive via 120 within the range of a UBM pad 210 may not be limited. For each UBM pad 220 that is outside the inner region 112 and within the outer region 114, the first zone 222 and the second zone 224 are defined. In some embodiments, the second zone 224 is defined to be a keep-out zone for conductive vias. No conductive via is allowed in any portion of the second zone 224, and a conductive via 120 may be disposed to overlap with the first zone 222, as described previously.

The present disclosure provides a better design for conductive via arrangement in order to reduce stress suffered by structures such as the ELK layer 130 or the conductive pad 140 during processes such as a ball mount process, a reflow process, or a surface mount technology (SMT) process. Some embodiments of the present disclosure arrange a conductive via 120 outside the high tensile stress region while being within the range of a UBM pad 220. The present disclosure provides an optimized via location for a semiconductor structure such as a WLCSP.

During processes such as a ball mount process, a reflow process, or an SMT process of the semiconductor structure 1, CTE mismatch between structures may lead to cracking or delamination. CTE mismatch may occur between structures such as the ELK layer 130, the conductive pad 140, the conductive via 120, the UBM pad 200, the conductive bump 300, or another substrate connected to the UBM pad 200 by the conductive bump 300. For example, during an SMT process, an area within the UBM pads 220 in the outer region 114 suffers a greater stress than an area within the UBM pads 210 in the inner region 112, which is the allowable region. That is because the stress resulting from CTE mismatch increases with the distance between the pad and the center 110C. For each UBM pad 220, the first zone 222 suffers a compressive stress and the second zone 224 suffers a tensile stress. Arranging a conductive via 120 within the tensile stress area may incur a higher risk of cracking or delamination for the ELK layer 130 or the Al pad below the UBM pad 220.

Figure 4:
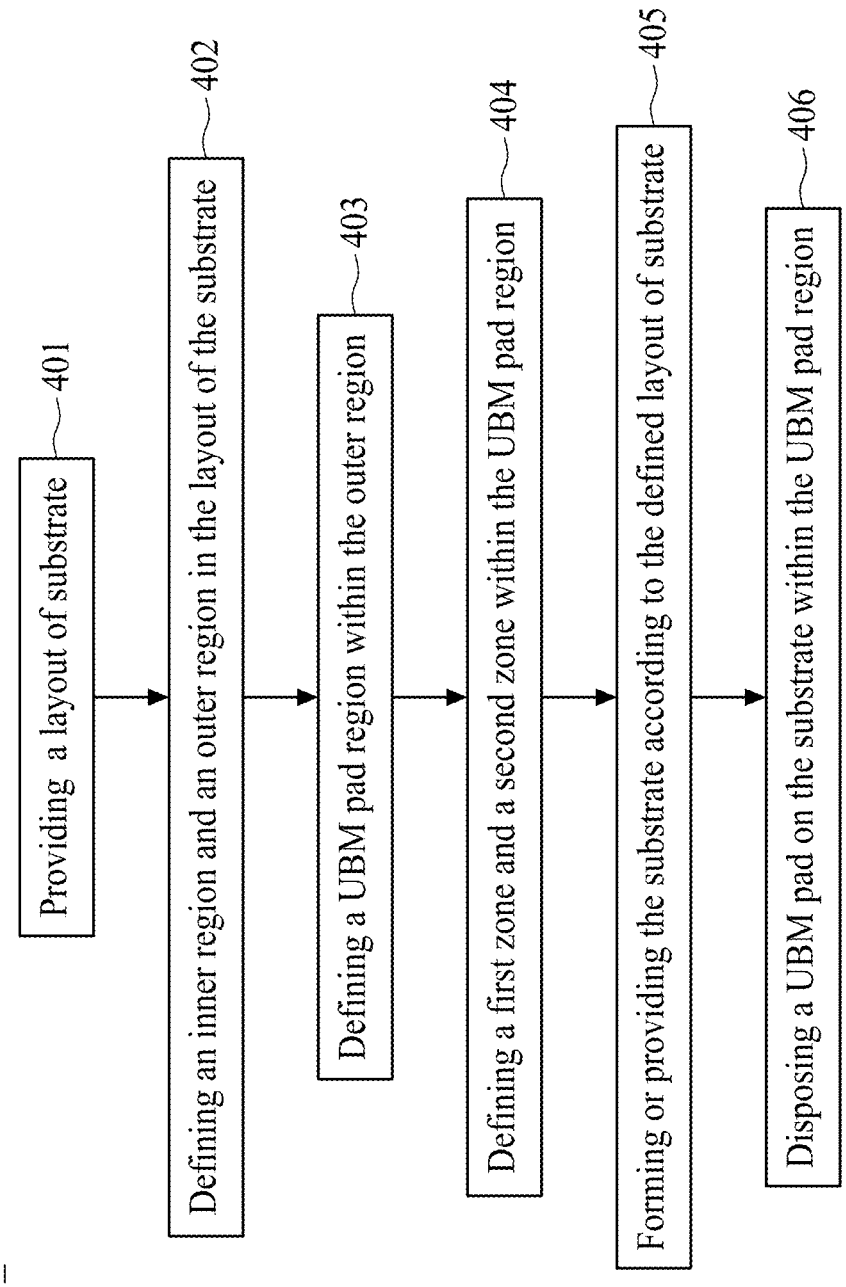
FIG. 4 is a flow chart showing a method of manufacturing a semiconductor structure in accordance with some embodiments of the present disclosure.

FIG. 4 is a flow chart of a method 4 for manufacturing a semiconductor structure. The method 4 includes operations 401, 402, 403, 404, 405, and 406. The order of operations illustrated in FIG. 4 is not limiting and serves as an embodiment only.

Figure 5A:
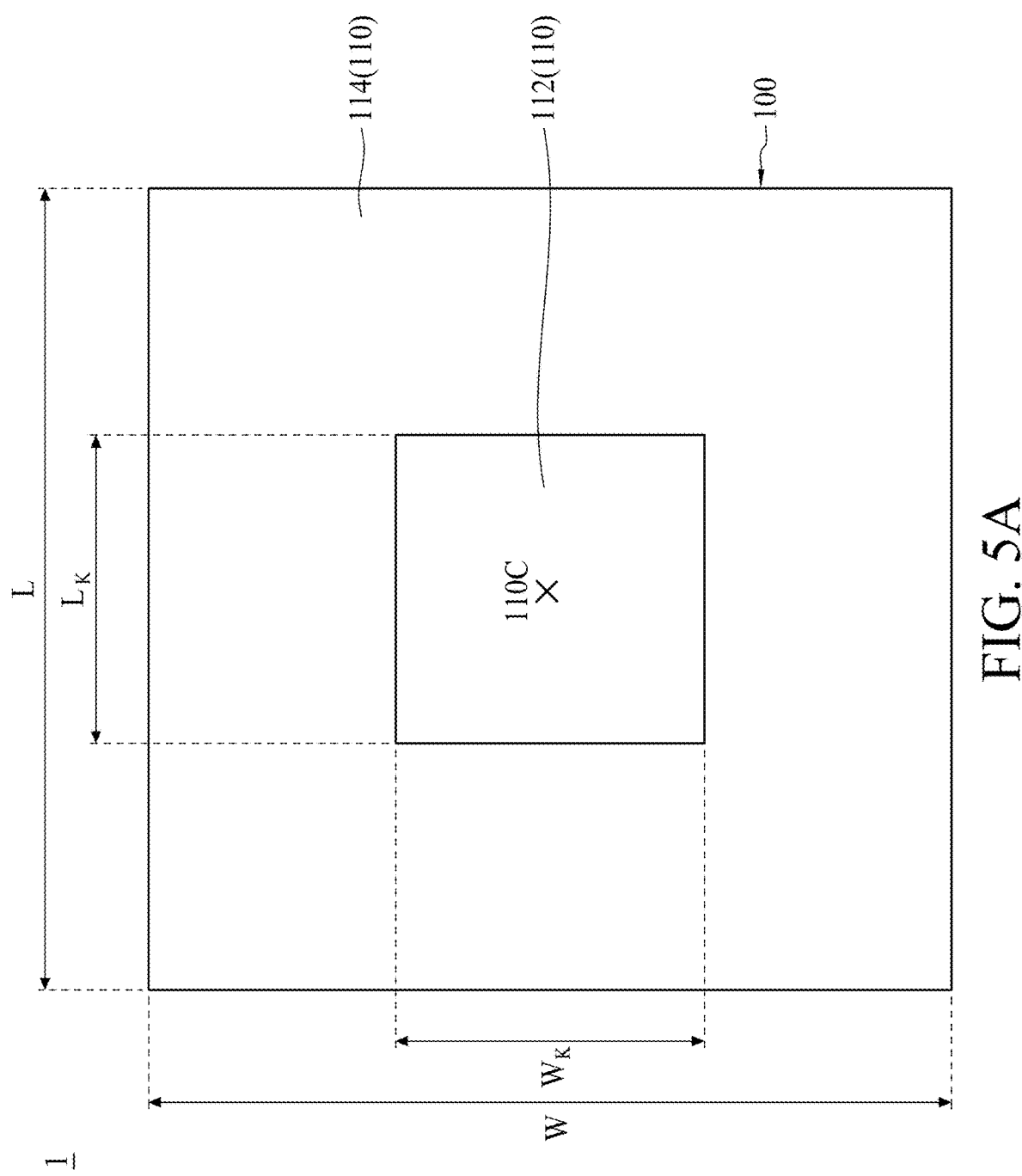
FIGS. 5A to 5C are schematic diagrams of intermediate stages of the method of FIG. 4, in accordance with some embodiments of the present disclosure.

FIG. 5A illustrates the operations 401 and 402 in FIG. 4. In operation 401, a layout of a substrate 100 is provided. In operation 402, an inner region 112 and an outer region 114 surrounding the inner region 112 are defined in the layout of the substrate 100. In some embodiments, a relationship between the inner region 112 and the substrate 100 is defined as follows:

$$L_K \leq 0.1 \times L^{1.8}, W_K \leq 0.1 \times W^{1.8},$$

wherein $L_K$ is a length of the inner region 112, L is a length of the substrate 100, $W_K$ is a width of the inner region 112, and W is a width of the substrate 100. In some embodiments, L is also a length of the outer region 114, and W is also a width of the outer region 114. In some embodiments, the substrate 100, the inner region 112 and the outer region 114 have configurations similar to those of the components described above or illustrated in FIG. 1 or FIG. 3. As shown in FIG. 5A, a center 110C is a center of the substrate 100.

Figure 5B:
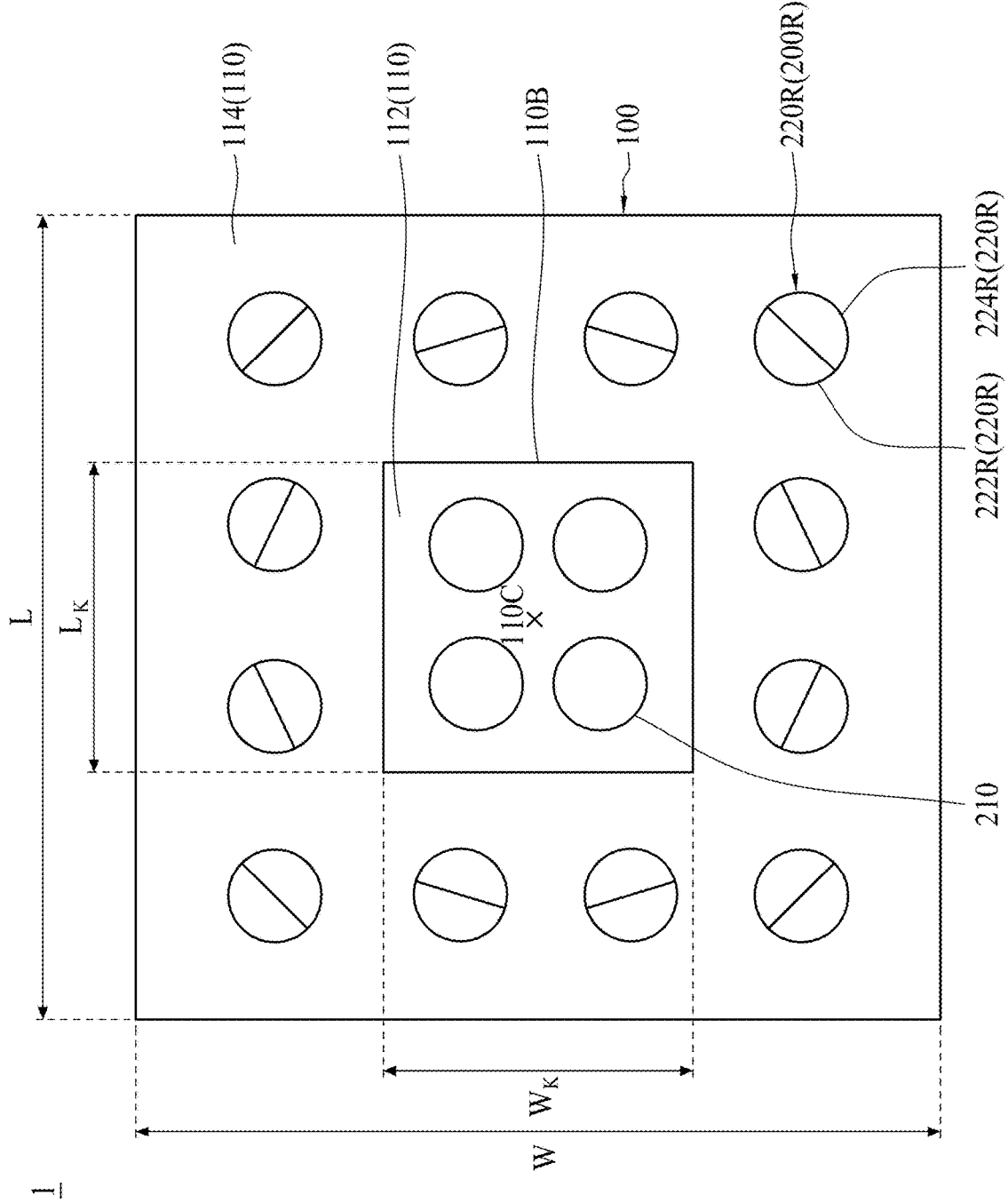

FIG. 5B illustrates the operations 403 and 404 in FIG. 4. In operation 403, several UBM pad regions 200R are defined in the layout of substrate 100. The UBM pad regions 200R include several UBM pad regions 210R within the inner region 112 and several UBM pad regions 220R within the outer region 114. In operation 403, within each UBM pad region 220R a first zone 222R and a second zone 224R are defined. The first zone 222R faces towards the center 110C from a top view perspective, and the second zone 224R faces away from the center 110C from a top view perspective. In some embodiments, the UBM pad regions 200R, the UBM pad regions 210R, the UBM pad regions 220R, the first zone 222R, and the second zone 224R correspond respectively to the UBM pads 200, the UBM pads 210, the UBM pads 220, the first zone 222, and the second zone 224 of FIG. 1 or FIG. 2.

Figure 5C:
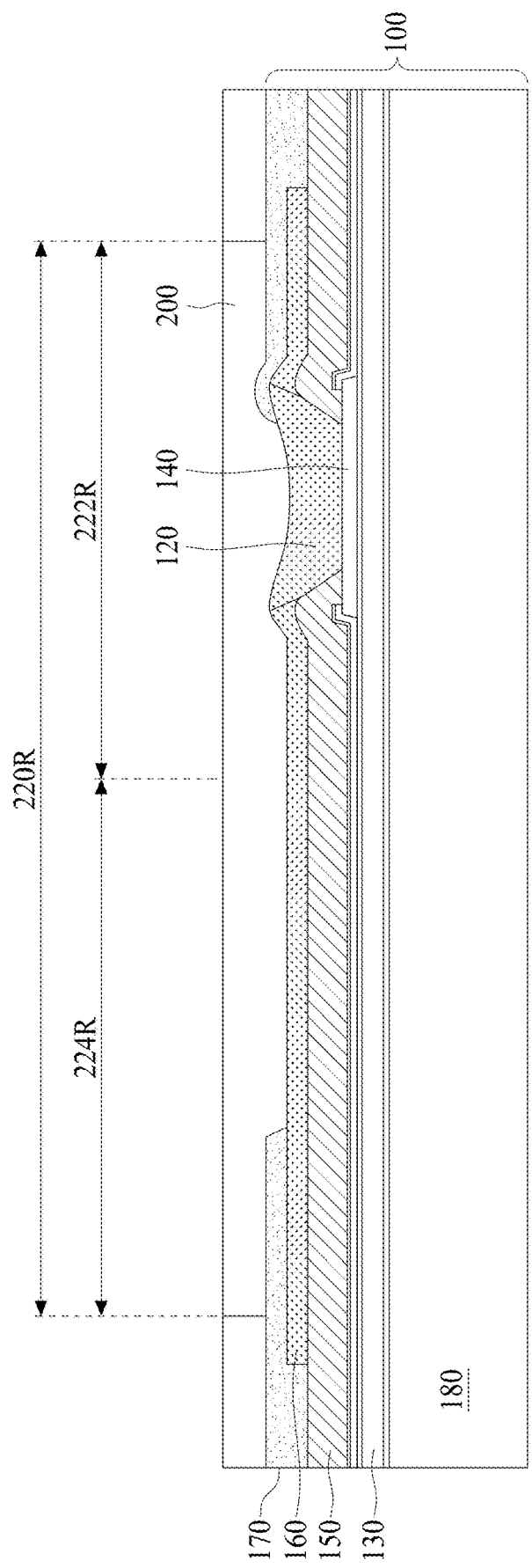

FIG. 5C illustrates the operations 405 and 406 of FIG. 4. In operation 405, the substrate 100 is provided or formed according to the layout of substrate 100 defined in operations 401 through 404. In some embodiments, the substrate 100 includes a semiconductor die 180. The semiconductor die 180 may be formed using operations such as lithography, deposition, and etching. A singulation operation may be used to separate the substrate 100 into individual semiconductor dies 180. In some embodiments, an ELK layer 130, a conductive pad 140, a first insulation layer 150 and a second insulation layer 170 may be sequentially formed over the semiconductor die 180. In some embodiments, a recess is formed in the second insulation layer 170. In some embodiments, the recess extends through the first insulation layer 150 and exposes the conductive pad 140.

Subsequently, during the operation 405, the conductive via 120 is formed in the recess. The conductive via 120 is conductively coupled to the conductive pad 140. In some embodiments, the conductive via 120 is disposed outside each second zone 224R. In some embodiments, the conductive via 120 at least partially overlaps a first zone 222R from a top view perspective. In operation 406, several UBM pads 200 are formed on the substrate 100 and within the UBM pad regions 200R. In some embodiments, the conductive via 120 and the UBM pad 200 have configurations similar to those described above or illustrated in FIG. 2.

Figure 6:
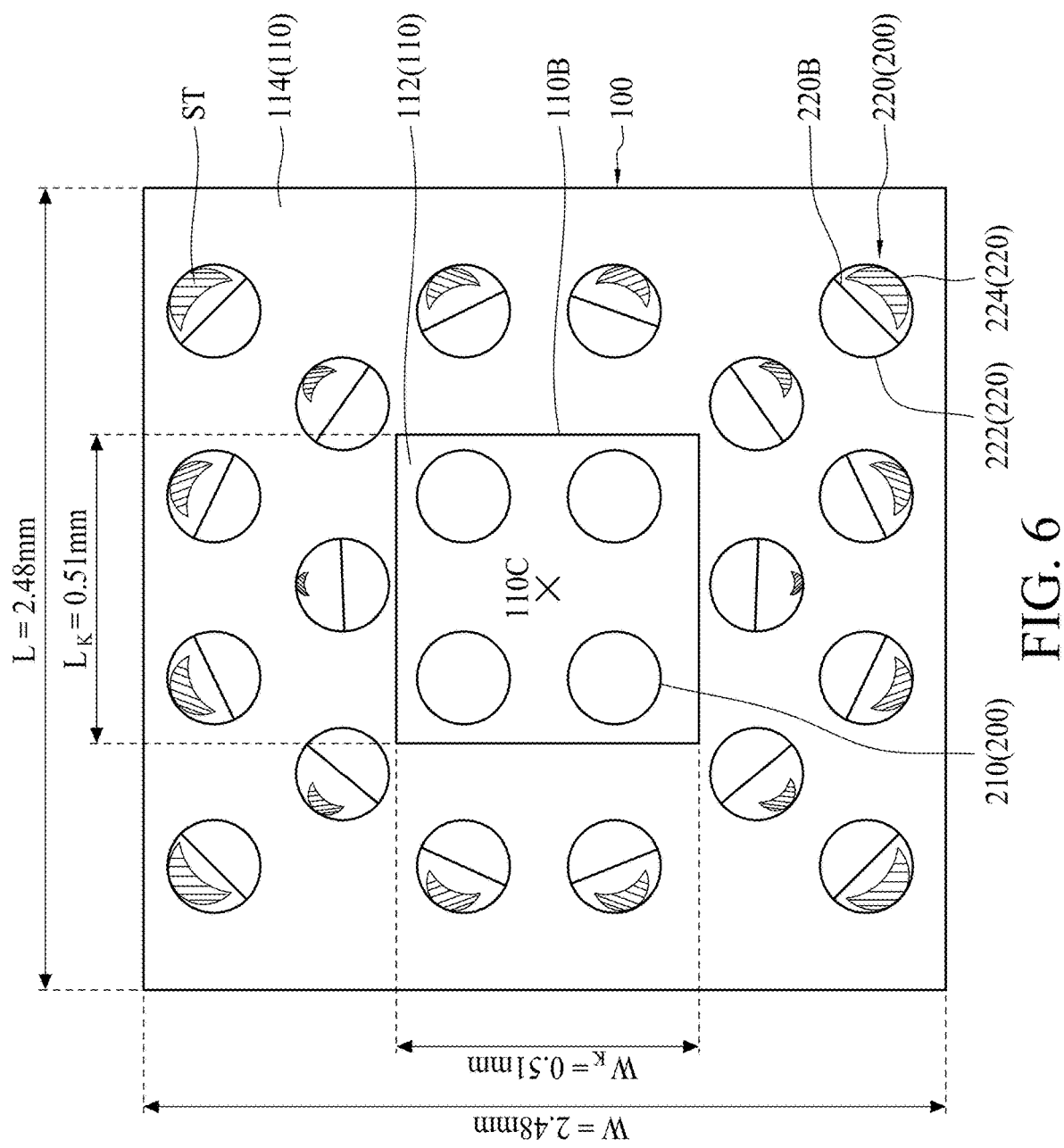
FIG. 6 is a plot showing a stress simulation result in accordance with some embodiments of the present disclosure.

FIG. 6 shows a plot of a stress simulation result within a semiconductor structure 1 in accordance with some embodiments of the present disclosure. The hatched areas ST indicate high stress areas, which are the areas where the ELK layer suffers relatively high stress during processes such as an SMT process, a ball mount process or a reliability test. The length L of the surface 110 is 2.48 mm, the width W of the surface 110 is 2.48 mm, the length $L_K$ of the inner region 112 is 0.51 mm, and the width $W_K$ of the inner region 112 is 0.51 mm. The size arrangement meets the criteria:

$$L_K \leq 0.1 \times L^{1.8}, W_K \leq 0.1 \times W^{1.8},$$

which is in accordance with some embodiments of the present disclosure.

As shown in FIG. 6, the UBM pads 210 within the inner region 112 (which is the allowable region for locations of conductive vias) do not include any high stress area; therefore a conductive via may be disposed in any position within the range of a UBM pad 210. However, for each UBM pad 220 in the outer region 114, a high stress area ST exists in the second zone 224. A conductive via disposed within the second zone 224 may lead to damage of the ELK layer. Therefore, in some embodiments of the present disclosure, each second zone 224 is defined as a keep-out zone for conductive vias. Furthermore, as shown in FIG. 6, each UBM pad 210 includes a first zone 222, which does not include a high stress area. Therefore, in some embodiments of the present disclosure, a conductive via is allowed to at least partially overlap the first zone 222. This provides a layout designer more flexibility to optimize a layout design.

Some embodiments of the present disclosure provide a semiconductor structure. The semiconductor structure includes a substrate having a surface and a conductive via in the substrate. The surface has an inner region and an outer region surrounding the inner region. The semiconductor structure also includes an under bump metallurgy (UBM) pad on the surface and within the outer region, where the UBM pad has a first zone and a second zone. The first zone faces towards a center of the surface and the second zone faces away from the center of the surface. The conductive via is disposed outside the second zone and at least partially overlaps the first zone from a top view perspective.

Some embodiments of the present disclosure provide a semiconductor structure. The semiconductor structure includes a substrate having a surface and a conductive via under the surface. The surface has an inner region and an outer region surrounding the inner region. The semiconductor structure further includes an under bump metallurgy (UBM) pad on the surface and within the outer region. The UBM pad has a first zone and a second zone, where the first zone faces towards a center of the surface, and the second zone faces away from the center of the surface. A portion of the conductive via that overlaps the first zone from a top view perspective is larger than a portion of the conductive via that overlaps the second zone from a top view perspective.

Some embodiments of the present disclosure provide a method for manufacturing a semiconductor structure. The method includes: providing a layout of a substrate; defining an inner region and an outer region surrounding the inner region in the layout of the substrate; defining an under bump metallurgy (UBM) pad region within the outer region; defining a first zone and a second zone within the UBM pad region, the first zone facing towards a center of the substrate, and the second zone facing away from the center of the substrate; forming the substrate according to the defined layout, the substrate including a conductive via disposed outside the second zone and at least partially overlapping the first zone from a top view perspective; and forming a UBM pad on the substrate and within the UBM pad region.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a surface and a conductive via in the substrate, the surface having an inner region and an outer region surrounding the inner region;
an under bump metallurgy (UBM) pad on the surface and within the outer region, the UBM pad having a first zone and a second zone, the first zone facing towards a center of the surface and the second zone facing away from the center of the surface, wherein the UBM pad overlaps an entirety of an upper surface of the conductive via; and
a redistribution layer laterally surrounding an upper portion of the conductive via, wherein the conductive via is disposed outside the second zone and at least partially overlaps the first zone from a top view perspective, wherein the redistribution layer comprises a top surface contacting the upper surface of the conductive via, the UBM pad contacting the top surface of the redistribution layer and the upper surface of the conductive via.

2. The semiconductor structure of claim 1, wherein the inner region and the surface meet the following relationship:

$$L_K \leq 0.1 \times L^{1.8}, W_K \leq 0.1 \times W^{1.8},$$

wherein $L_K$ is a length of the inner region, L is a length of the surface, $W_K$ is a width of the inner region, and W is a width of the surface.

3. The semiconductor structure of claim 1, wherein the substrate further comprises an insulation layer between the conductive via and the UBM pad.

4. The semiconductor structure of claim 1, wherein the UBM pad has a circular shape, the first zone has a semicircular shape and accounts for one half of the UBM pad, and the first zone includes a curved edge of the semicircular shape facing the center of the surface.

5. The semiconductor structure of claim 4, wherein the second zone accounts for the other half of the UBM pad, and the second zone includes a curved edge of the semicircular shape facing away from the center.

6. The semiconductor structure of claim 1, wherein a boundary line between the first zone and the second zone is perpendicular to a line connecting a center of the UBM pad and the center of the surface.

7. The semiconductor structure of claim 1, further comprising:
a conductive bump on the UBM pad, wherein the redistribution layer is conductively coupled to the conductive bump through the UBM pad.

8. The semiconductor structure of claim 1, further comprising a dielectric layer under the UBM pad, wherein the dielectric layer has a dielectric value (k-value) less than 3.8 and at least partially overlaps the conductive via from a top view perspective.

9. The semiconductor structure of claim 1, wherein the UBM pad has a circular shape, the first zone has a quarter-circular shape and accounts for a quarter of the UBM pad, and the first zone includes a curved edge of the quarter-circular shape facing the center.

10. A semiconductor structure, comprising:
a substrate having a surface and a conductive via under the surface, the surface having an inner region and an outer region surrounding the inner region;
an under bump metallurgy (UBM) pad on the surface and within the outer region, the UBM pad having a first zone and a second zone, the first zone facing towards a center of the surface, and the second zone facing away from the center of the surface;
a redistribution layer overlapped with an entirety of the UBM pad and laterally surrounding the conductive via; and
a first insulation layer covering a portion of a top surface of the conductive via,
wherein a first portion of the conductive via overlapping the first zone from a top view perspective is larger than a second portion of the conductive via overlapping the second zone from a top view perspective,
wherein the first insulation layer is arranged between the UBM pad and the redistribution layer.

11. The semiconductor structure of claim 10, wherein the inner region and the surface meet the following relationship:

$$L_K \leq 0.1 \times L^{1.8}, W_K \leq 0.1 \times W^{1.8},$$

wherein $L_K$ is a length of the inner region, L is a length of the surface, $W_K$ is a width of the inner region, and W is a width of the surface.

12. The semiconductor structure of claim 10, wherein the substrate further comprises a second insulation layer between the conductive pad and the first insulating layer and surrounding the conductive via.

13. The semiconductor structure of claim 10, wherein the UBM pad has a circular shape, the first zone has a semicircular shape and accounts for half of the UBM pad, and the first zone includes a curved edge of the semicircular shape facing the center.

14. The semiconductor structure of claim 13, wherein the second zone has a semicircular shape and accounts for the other half of the UBM pad, and the second zone includes a curved edge of the semicircular shape facing away from the center.

15. The semiconductor structure of claim 10, wherein a boundary line between the first zone and the second zone is perpendicular to a line connecting a center of the UBM pad and the center of the surface.

16. The semiconductor structure of claim 10, further comprising:
a semiconductor die, wherein the conductive pad is conductively coupling the semiconductor die with the conductive via.

17. The semiconductor structure of claim 10, further comprising a dielectric layer under the UBM pad, wherein the dielectric layer has a dielectric value (k-value) less than 3.8 and at least partially overlaps the conductive via from a top view perspective.

18. The semiconductor structure of claim 10, wherein the UBM pad has a circular shape, the first zone has a quarter-circular shape and accounts for a quarter of the UBM pad, and the first zone includes a curved edge of the quarter-circular shape facing the center.

19. A semiconductor structure, comprising:
a substrate comprising a conductive via;
an under bump metallurgy (UBM) pad over the substrate, the UBM pad partitioned into a first zone and a second zone, the first zone and the second zone having equal areas, the first zone associated with a first stress, and the second zone associated with a second stress greater than the first stress;
a redistribution layer coupled to the conductive via; and
an insulation layer extending between the UBM pad and the conductive via, wherein the UBM pad is in physical contact with the redistribution layer, the insulation layer and the conductive via,
wherein a first area of the conductive via projecting onto the first zone is larger than a second area of the conductive via projecting onto the second zone from a top-view perspective.

20. The semiconductor structure of claim 19, wherein the conductive via is completely within the first zone.

* * * * *